(12) United States Patent
Davis et al.

(10) Patent No.: US 9,470,593 B2
(45) Date of Patent: Oct. 18, 2016

(54) MEDIA ISOLATED PRESSURE SENSOR

(71) Applicant: Honeywell International Inc., Morristown, NJ (US)

(72) Inventors: Richard A. Davis, Plano, TX (US); Carl Stewart, Plano, TX (US)

(73) Assignee: Honeywell International Inc., Morris Plains, NJ (US)

( * ) Notice: Subject to any disclaimer, the term of this patent is extended or adjusted under 35 U.S.C. 154(b) by 178 days.

(21) Appl. No.: 14/024,919

(22) Filed: Sep. 12, 2013

(65) Prior Publication Data
US 2015/0068315 A1 Mar. 12, 2015

(51) Int. Cl.
| *G01L 9/06* | (2006.01) |
| *G01L 9/00* | (2006.01) |
| *H05K 3/30* | (2006.01) |

(Continued)

(52) U.S. Cl.
CPC .......... *G01L 9/0052* (2013.01); *G01L 19/0007* (2013.01); *G01L 19/0038* (2013.01); *G01L 19/0061* (2013.01); *G01L 19/147* (2013.01); *H05K 3/30* (2013.01); *G01L 9/0055* (2013.01); *G01L 9/0092* (2013.01); *G01L 19/0084* (2013.01); *G01L 19/0627* (2013.01); *G01L 19/0645* (2013.01); *G01L 19/148* (2013.01); *H01L 2224/48137* (2013.01);

(Continued)

(58) Field of Classification Search
CPC ............ G01L 19/147; G01L 19/0627; G01L 19/0038; G01L 19/0084; G01L 19/148; G01L 19/0007; G01L 19/0645; G01L 9/0052; G01L 9/0055; G01L 9/0092; H01L 2224/48137; H01L 2224/73265

USPC .......... 73/754, 715, 716, 720, 721, 727, 746
See application file for complete search history.

(56) References Cited

U.S. PATENT DOCUMENTS

| 4,600,912 A | * | 7/1986 | Marks et al. | .............. 338/42 |
| 4,656,454 A | * | 4/1987 | Rosenberger | ................ 338/2 |

(Continued)

FOREIGN PATENT DOCUMENTS

| EP | 0202786 A2 | 4/1986 |
| WO | 2011140140 A1 | 11/2011 |

OTHER PUBLICATIONS

"Cavity." Merriam-Webster.com. Merriam-Webster, n.d. Web. Oct. 5, 2015. <http://www.merriam-webster.com/dictionary/cavity>.*

(Continued)

*Primary Examiner* — Lisa Caputo
*Assistant Examiner* — Jonathan Dunlap
(74) *Attorney, Agent, or Firm* — Conley Rose, P.C.; Kristin Jordan Harkins

(57) ABSTRACT

A pressure sensor includes a pressure sensing element and a top cap. The pressure sensing element includes a bonded wafer substrate having a buried sealed cavity. A wall of the buried sealed cavity forms a sensing diaphragm. One or more sense elements may be supported by the sensing diaphragm and one or more bond pads are supported by the upper side of the bonded wafer substrate. Each of the bond pads may be positioned adjacent to the sensing diaphragm and electrically connected to one or more of the sense elements. The top cap may be secured to the upper side of the bonded wafer substrate such that an aperture in the top cap facilitates passage of a media in a downward direction to the sensing diaphragm. The top cap may be configured to isolate the bond pads from the media.

20 Claims, 5 Drawing Sheets

(51) Int. Cl.
  *G01L 19/00* (2006.01)
  *G01L 19/06* (2006.01)
  *G01L 19/14* (2006.01)

(52) U.S. Cl.
  CPC . *H01L 2224/73265* (2013.01); *Y10T 29/4913* (2015.01); *Y10T 29/49155* (2015.01)

(56) References Cited

U.S. PATENT DOCUMENTS

| | | | |
|---|---|---|---|
| 4,682,503 A | 7/1987 | Higashi et al. | |
| 4,773,269 A | 9/1988 | Knecht et al. | |
| 4,879,627 A | 11/1989 | Grantham | |
| 5,029,478 A | 7/1991 | Wamstad | |
| 5,207,102 A * | 5/1993 | Takahashi | G01L 19/0084 29/621.1 |
| 5,303,167 A | 4/1994 | Bonne | |
| 5,385,046 A | 1/1995 | Yamakawa et al. | |
| 5,459,351 A | 10/1995 | Bender et al. | |
| 5,528,452 A | 6/1996 | Ko et al. | |
| 5,591,679 A | 1/1997 | Jakobsen et al. | |
| 5,644,285 A * | 7/1997 | Maurer | 338/39 |
| 6,036,872 A | 3/2000 | Wood et al. | |
| 6,098,460 A * | 8/2000 | Otsuchi | G01L 5/0052 310/331 |
| 6,351,996 B1 * | 3/2002 | Nasiri | G01L 19/0038 73/706 |
| 6,629,465 B1 * | 10/2003 | Maluf | G01L 9/0042 73/715 |
| 7,028,552 B2 * | 4/2006 | Obermeier | 73/754 |
| 7,073,375 B2 | 7/2006 | Parker et al. | |
| 7,077,008 B2 * | 7/2006 | Pham et al. | 73/716 |
| 7,107,854 B1 | 9/2006 | Czarnocki | |
| 7,176,541 B2 * | 2/2007 | Tanaka | G01L 19/147 257/414 |
| 7,216,547 B1 | 5/2007 | Stewart et al. | |
| 7,395,718 B2 * | 7/2008 | Obermeier | 73/754 |
| 7,775,119 B1 | 8/2010 | Suminto et al. | |
| 8,230,745 B2 | 7/2012 | Rozgo et al. | |
| 8,256,301 B2 | 9/2012 | Jakobsen | |
| 8,297,125 B2 | 10/2012 | Stewart et al. | |
| 8,297,127 B2 * | 10/2012 | Wade et al. | 73/721 |
| 8,316,533 B2 | 11/2012 | Suminto et al. | |
| 8,322,225 B2 * | 12/2012 | Bentley et al. | 73/754 |
| 8,359,927 B2 | 1/2013 | Hooper et al. | |
| 8,371,176 B2 | 2/2013 | Rozgo | |
| 8,490,496 B2 | 7/2013 | Bentley | |
| 2002/0029639 A1 | 3/2002 | Wagner et al. | |
| 2003/0167851 A1 * | 9/2003 | Parker | G01L 9/0054 73/720 |
| 2005/0252298 A1 * | 11/2005 | Obermeier | 73/715 |
| 2005/0269654 A1 * | 12/2005 | Tanaka | G01L 19/147 257/415 |
| 2006/0196275 A1 * | 9/2006 | Obermeier | 73/754 |
| 2008/0006092 A1 | 1/2008 | Brida et al. | |
| 2009/0288492 A1 * | 11/2009 | Stewart et al. | 73/716 |
| 2011/0005326 A1 * | 1/2011 | Bentley et al. | 73/754 |
| 2012/0174680 A1 | 7/2012 | Wade et al. | |
| 2012/0297884 A1 * | 11/2012 | Gamage | G01L 9/0047 73/717 |
| 2013/0075888 A1 * | 3/2013 | Chang | B81C 1/0023 257/704 |

OTHER PUBLICATIONS

Seal. Merriam-Webster.com. Merriam-Webster, n.d. Web. Oct. 5, 2015. <http://www.merriam-webster.com/dictionary/seal>.*
Honeywell, "Sensing Controls: Understanding Absolute Pressure Sensors," Honeywell International Inc., 4 pages, 2004. 008116-1-EN IL50 GLO 1104.
Suni et al., "Silicon-on-Insulator Wafers with Buried Cavities," Journal of the Electrochemical Society, Publication C, vol. 153, 6 pages, 2006.
Goldman et al., "A Vertically Integrated Media-Isolated Absolute Pressure Sensor," International Conference on Solid-State Sensors and Actuators, p. 1501-1504, Jun. 19, 1997. 4D3.14P.
PCT Application No. PCT7US2014/052604, International Preliminary Report on Patentability, mailed Mar. 24, 2016, 8 pages.

* cited by examiner

MEDIA ISOLATED PRESSURE SENSOR

TECHNICAL FIELD

The present disclosure relates generally to pressure sensors, and more particularly, to media isolated pressure sensors.

BACKGROUND

Pressure sensors are used in a wide variety of applications including, for example, commercial, automotive, aerospace, industrial, and medical applications. Pressure sensors often use a pressure sense die that is mounted to a pressure sensor package using a die attach. The pressure sense die is often configured to detect a pressure of a sensed media by converting mechanical stress induced by the sensed media in a sense diaphragm of the pressure sense die into an electrical output signal. The most common configuration for a pressure sensor used for high pressure applications allows for fluid pressure to be applied to the top side of the pressure sense die while at the time allowing the fluid to be sensed to come into contact with the electrical components of the sensor. If the fluid is an inert gas, then such a configuration may be sufficient. However, in some applications, the sensed media may be corrosive or conductive, and exposure to the fluid to be sensed can cause damage to some components of the pressure sensor die and/or may cause a short in some of the electrical components of the pressure sense die. For these applications, it may be desirable to isolate the sensitive components of the pressure sensor die from the media to be sensed. Also, for higher pressure applications, it may be desirable to mount the pressure sense die to the pressure sensor package such that the incoming, downward pressure of the media does not cause the die attach to fail which is a common deficiency of sensors when high pressures are applied to a backside of the sensor. A sensor construction that allows for the downward application of pressure to the sensing die and that also isolates the sensitive components of the pressure sensing die from the media to be sensed may provide a robust pressure sensor that can be used in a variety of environments.

SUMMARY

The present disclosure relates generally to pressure sensors, and more particularly, to media isolated pressure sensors.

An example pressure sensor may include a pressure sensing element and a top cap. The pressure sensing element may include a bonded wafer substrate having a buried sealed cavity. A wall of the buried sealed cavity may form a sensing diaphragm along on an upper side of the bonded wafer substrate. One or more sense elements may be supported by the sensing diaphragm of the bonded wafer substrate, and one or more bond pads may be supported by the upper side of the bonded wafer substrate. Each of the one or more bond pads may be positioned adjacent to the sensing diaphragm and electrically connected to one or more of the sense elements. The top cap may be secured to the upper side of the bonded wafer substrate such that an aperture in the top cap facilitates passage of a media to the sensing diaphragm. The top cap may also be configured to isolate the one or more bond pads of the pressure sensing element from the media.

A method of making a pressure sensor may include obtaining a bonded wafer substrate having a buried sealed cavity, wherein a wall of the buried sealed cavity forms a sensing diaphragm along on an upper side of the bonded wafer substrate. One or more sense elements may be provided on the sensing diaphragm of the bonded wafer substrate. One or more bond pads may be provided on the upper side of the bonded wafer substrate. Each of the one or more bond pads may be positioned adjacent to the sensing diaphragm and electrically connected to one or more of the sense elements. A top cap may be secured to the upper side of the bonded wafer substrate. The top cap may include an aperture that facilitates passage of a media to the sensing diaphragm. The top cap may also be configured to isolate the one or more bond pads from the media during use.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

Figure 1:
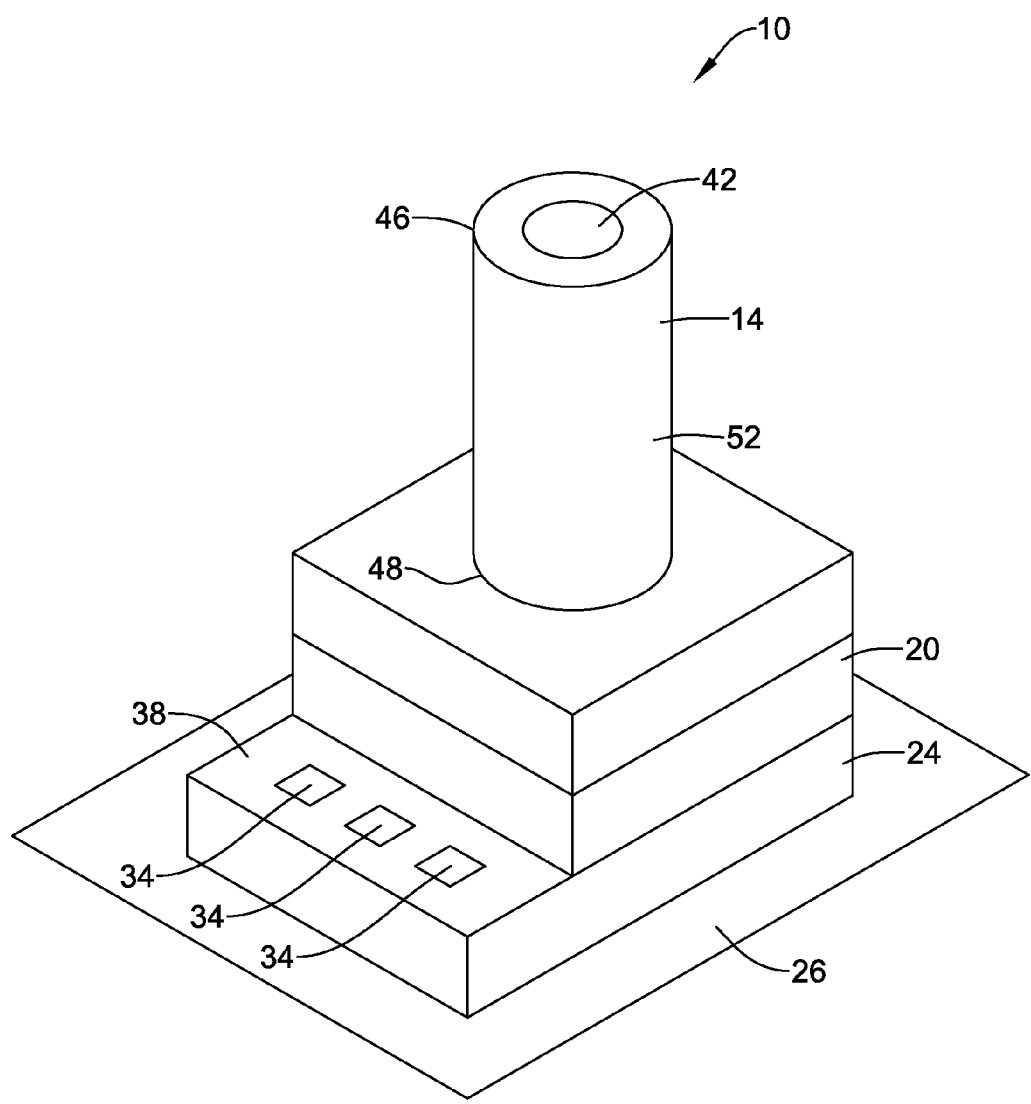
FIG. 1 is a perspective view of an illustrative media isolated pressure sensor.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and the drawing, which is not necessarily to scale, depicts an illustrative embodiment and is not intended to limit the scope of the disclosure. The illustrative embodiment depicted is intended only as exemplary.

As used herein, the term "fluid" is not intended to be limited to a liquid. Rather, the term "fluid" is intended to include any material subject to flow such as, but not limited to, liquids and/or gases.

Figure 2:
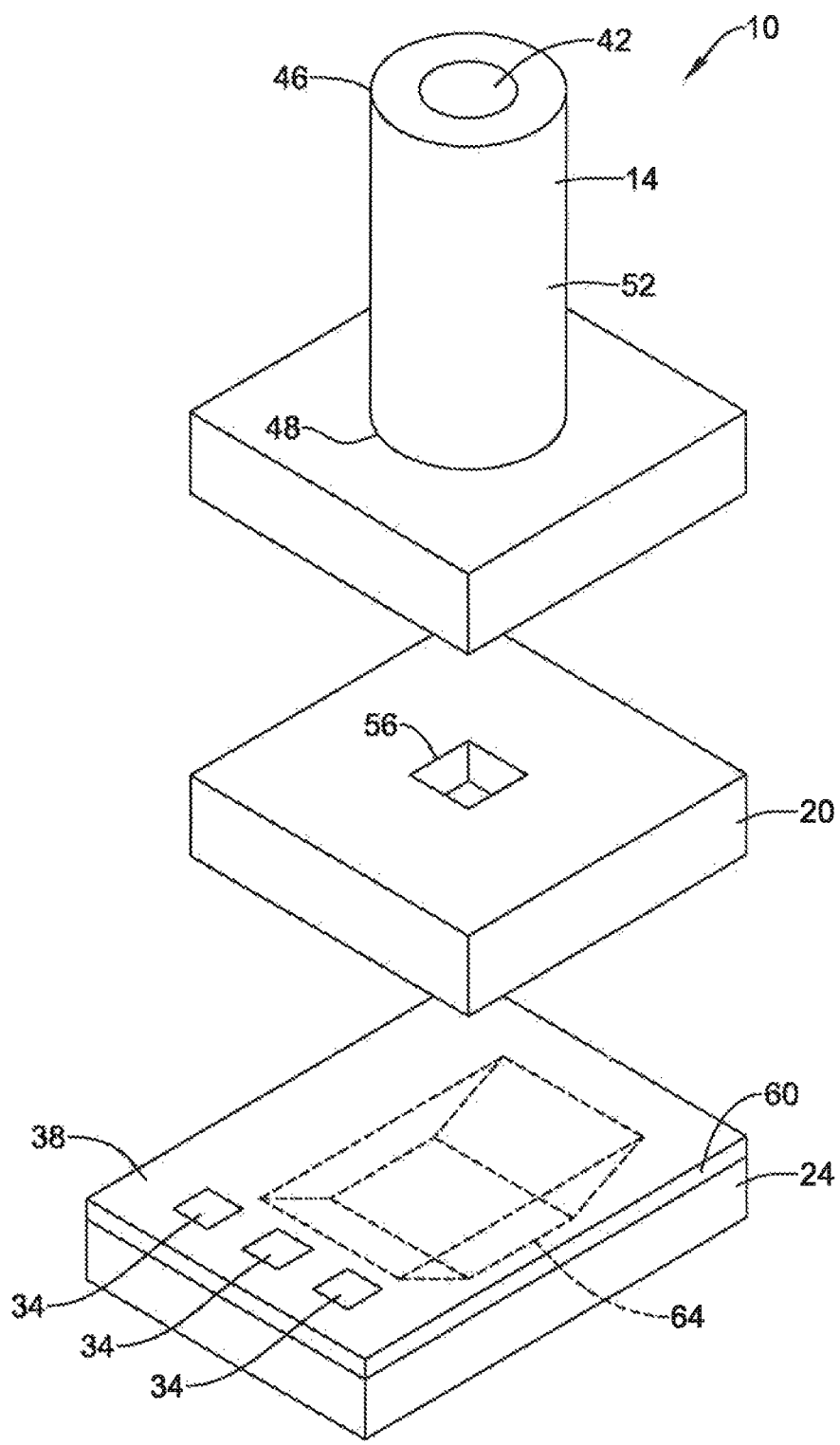
FIG. 2 is an exploded view of the pressure sensor shown in FIG. 1.
Figure 3:
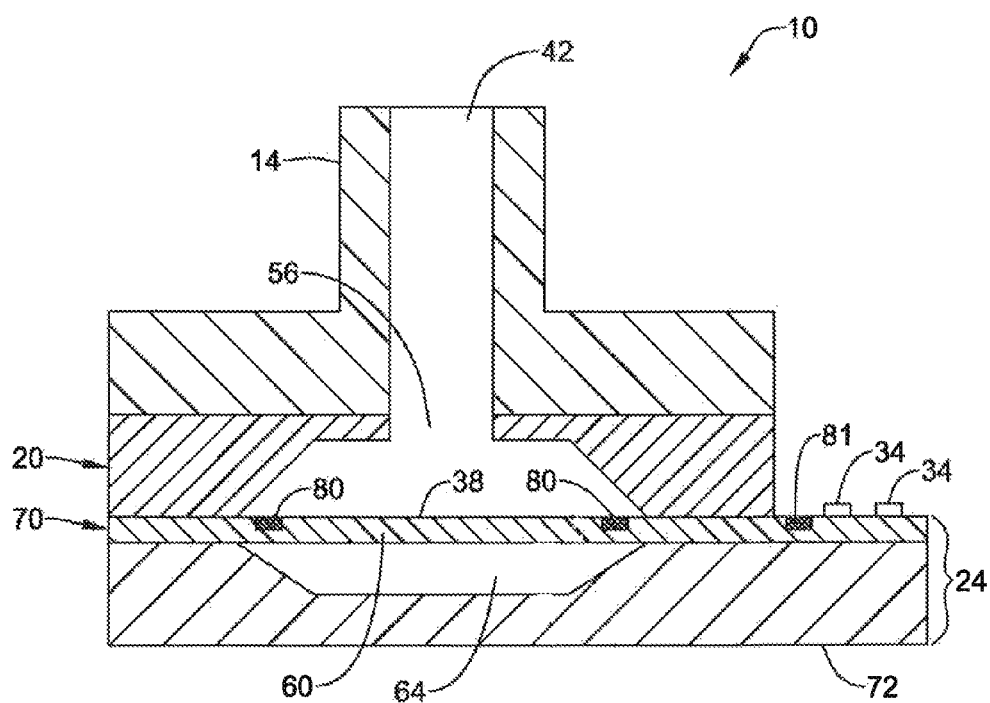
FIG. 3 is a cross-sectional view of the pressure sensor shown in FIG. 1.

FIGS. 1-3 provide different views of an illustrative media isolated reference pressure sensor 10 for sensing a pressure of a liquid or a gas. FIG. 1 is a perspective view of an illustrative media isolated reference pressure sensor 10. FIG. 2 is an exploded view, and FIG. 3 is a cross-sectional view of the reference pressure sensor 10 of FIG. 1. It is contemplated that the reference pressure sensor 10, as described herein, may be suitable for use in high pressure applications. High pressure applications may be those applications exceeding 250 psi of pressure. While the pressure sensor 10 as described herein may provide a more robust sensor arrangement for high pressure applications, it will be generally understood that such a pressure sensor 10 may also be used in lower pressure applications.

The illustrative media isolated reference pressure sensor 10 may include a pressure port 14 attached to a top cap 20, which may be coupled to a pressure sense element such as a pressure sense die 24. In some cases, the pressure sense die 24 may be fabricated using a bonded silicon wafer having a buried sealed cavity 64. The buried sealed cavity 64 may have a vacuum reference pressure, or any other suitable reference pressure as desired. When so provided, the bonded silicon wafer may form a sensing diaphragm 60 that is referenced to the reference pressure in the buried sealed cavity 64. The sensing diaphragm 60 may be stressed and/or deform in response to an applied pressure by the media. This stress and/or deformation can be detected by one or more sense elements 80 on or embedded within the sensing diaphragm 60. Output signals that are related to the applied pressure may be provided via one or more bond pads 34.

The top cap 20 may be bonded to the pressure sensing die 24 such that wire bond pads 34 on an upper surface 38 of the pressure sensing die 24 are isolated from the media to be sensed. While not required, the pressure sensor 10 may be constructed such that pressure from the media to be sensed is applied to the upper surface 38 of the pressure sensing die 24 as shown, which may force the pressure sensing die 24 toward a suitable carrier 26 (see FIG. 1) such as a ceramic carrier, a glass carrier, or a printed circuit board (PCB). The downward application of pressure to the upper surface 38 of the pressure sensing die 24 and the carrier 26 may prevent or reduce the possibility of the dislodgement of the pressure sensing die 24 from the carrier 26, and may result in little or no pull apart force at the die attach interface between the pressure sensing die 24 and the carrier 26 which may provide a more robust sensor that may be able to withstand higher pressures. This may be particularly useful in high pressure applications such as those applications exceeding 250 psi.

As shown in FIGS. 1-3, the pressure port 14 may define a fluid passageway 42 that permits a media (fluid or gas) to flow into the pressure sensor 10 from a first end 46 to a second end 48. In many instances, the fluid passageway 42 may direct the media such that it contacts an upper side 38 of the pressure sense die 24, as will be described in greater detail below. In some cases, the pressure port 14 may include an elongated tubular structure 52 defining the fluid passageway 42. In some cases, the elongated tubular structure 52 may include an elbow, bend or some other configuration or shape, depending upon the application. Regardless of the configuration, the fluid passageway 42 may direct fluid flow to the pressure sense die 24 such that it contacts an upper surface 38 of the pressure sense die 24. The pressure port 14 may be formed from metal, ceramic, glass, thermoplastic and/or any other suitable material or material combination. In some instances, the pressure port 14 may be an injection molded, thermoplastic pressure port 14, but this is not required. In some cases, the opening at the first end 46 of the fluid passageway 42 may include a variety of interface options and/or connections, depending upon the desired application. In one case, for example, the pressure port 14 may include a threaded region located at the first end 46 for threadably engaging with another threaded component. As shown in FIGS. 1-3, the pressure port 14 may be attached to top cap 20. In some cases, the pressure port 14 may be attached to the top cap 20 using a die attach material. Exemplary die attach materials include a variety of adhesives and/or silicone, but these are only examples.

In some instances, the top cap 20 may be a silicon or glass die, and may include an opening or other aperture 56 that allows media introduced through the pressure port 14 to come into contact with an upper surface 38 of the pressure sensing die 24 when the top cap wafer 20 is bonded to the pressure sensing die 24, as can be best seen in FIGS. 2 and 3. The size and shape of the aperture 56 may be any suitable size and/or shape that allows passage of fluid through the top cap wafer 20 such that the fluid comes into contact with and applies a pressure to the pressure sensing die 24. In some cases, the aperture 56 may include a plurality of apertures. It is contemplated that the top cap 20 may be bonded to the pressure sensing die 24 using a variety of bonding techniques including, but not limited to, anodic bonding, glass frit bonding, direct bonding, adhesive bonding, metallic bonding, and/or using any other suitable bonding technique. The top cap 20 may be bonded to the upper surface 38 of the pressure sensing die 24 such that the wire bond pads 34 on the upper surface 38 of the pressure sensing die 24 are isolated from the media to be sensed. Isolating the wire bond pads 34 and/or other electrical components of the pressure sensing die from the media to be sensed may prevent damage to some components of the pressure sensor die and/or may prevent an electrical short that may otherwise result when the electrical components come into contact with a conductive and/or corrosive media. This may increase the long term performance and reliability of the pressure sensor 10. In some instances, as shown in greater detail in FIG. 5, the top cap 20 may include a number of openings or holes 94 corresponding to one or more of the wire bond pads 34 that are on the upper surface 38 of the pressure sensing die 24 such that when the top cap 20 is bonded to the pressure sensing die 24, the wire bond pads 34 are exposed through the holes 94 in the top cap wafer 20 and accessible for electrical connection to other components via wire bonds or the like, but this is not required.

As discussed above, the pressure sensing die 24 may be fabricated starting with a bonded silicon wafer having a buried sealed cavity 64. As best shown in FIG. 3, the bonded silicon wafer may include a first wafer 70 bonded to a second wafer 72. The second wafer 72 (and/or first wafer 70) may include a recess that, after the first wafer 70 is bonded to the second wafer 72, forms a buried sealed cavity 64. A variety of micro-fabrication techniques including but not limited to lithography techniques, wet etching techniques, and dry etching techniques may be used to form the recess. The first wafer 70 may be bonded to the second wafer 72 in a vacuum environment, thereby leaving a vacuum reference pressure in the buried sealed cavity 64. The second wafer 72 may be bonded to the first wafer 70 using a variety of bonding techniques including direct bonding techniques. Direct bonding the first wafer 70 to the second wafer 72 may minimize the thermal mismatch between materials. As can be seen, the first wafer 70 may define part of the buried sealed cavity 64, thereby conveniently forming a sensing diaphragm 60 (see FIG. 3).

The first wafer 70 and the second wafer 72 may be silicon wafers that are bonded together as described above. In another example, the pressure sensing die 24 may be formed using a Silicon-On-Insulator (SOI) wafer having a buried sealed cavity 64. Such a pressure sensing die 24 may be similar to that shown in FIG. 3, except that an insulator layer is included between the first wafer 70 and the second wafer

72. Also, the first wafer 70 may include an epitaxial grown silicon layer, rather than a stand alone silicon wafer. In any event, these are only example silicon wafers having a buried sealed cavity 64. It is contemplated that any suitable substrate and/or any suitable material or material combination may be used, as desired.

In some instances, starting with the bonded silicon wafer having a buried sealed cavity 64, standard pattern, implant, diffusion and/or metal interconnect processes may be used to form one or more elements on the upper surface 38 of the bonded silicon wafer. For example, one or more piezoresistive sense elements 80 may be formed on the sensing diaphragm 60. The piezoresistive sense elements 80 may be configured to have an electrical resistance that varies according to an applied mechanical stress (e.g. deflection of pressure sensing diaphragm 60). The piezoresistive sense elements 80 can thus be used to convert the applied pressure into an electrical signal. In some instances, the piezoresistive components may include a silicon piezoresistive material; however, other non-silicon materials may be used. In some cases, the piezoresistive sense elements 80 may be connected in a Wheatstone bridge configuration (full or half bridge). It will be generally understood that the piezoresistive sense elements 80 are only one example of a pressure sensing element, and it is contemplated that any other suitable sensing elements may be used, as desired.

One or more bond pads 34 may be formed on the upper surface 38 of the bonded silicon wafer and adjacent to the sensing diaphragm 60. Metal, diffusion or other interconnect may be provided to interconnect the one or more piezoresistive sensor elements 80 and the one or more bond pads 34. In some cases, signal conditioning circuitry 81 may also be formed in or on the upper surface 38 of the bonded silicon wafer (see FIG. 3). The signal conditioning circuitry 81 may condition one or more sensor signals received from the one or more sense elements 80 before providing a conditioned output to one or more of the bond pads 34. For example, the signal conditioning circuitry 81 may include amplification, analog-to-digital conversion, offset compensation circuitry, linearization, temperature compensation, and/or other suitable signal conditioning functions.

Figure 4:
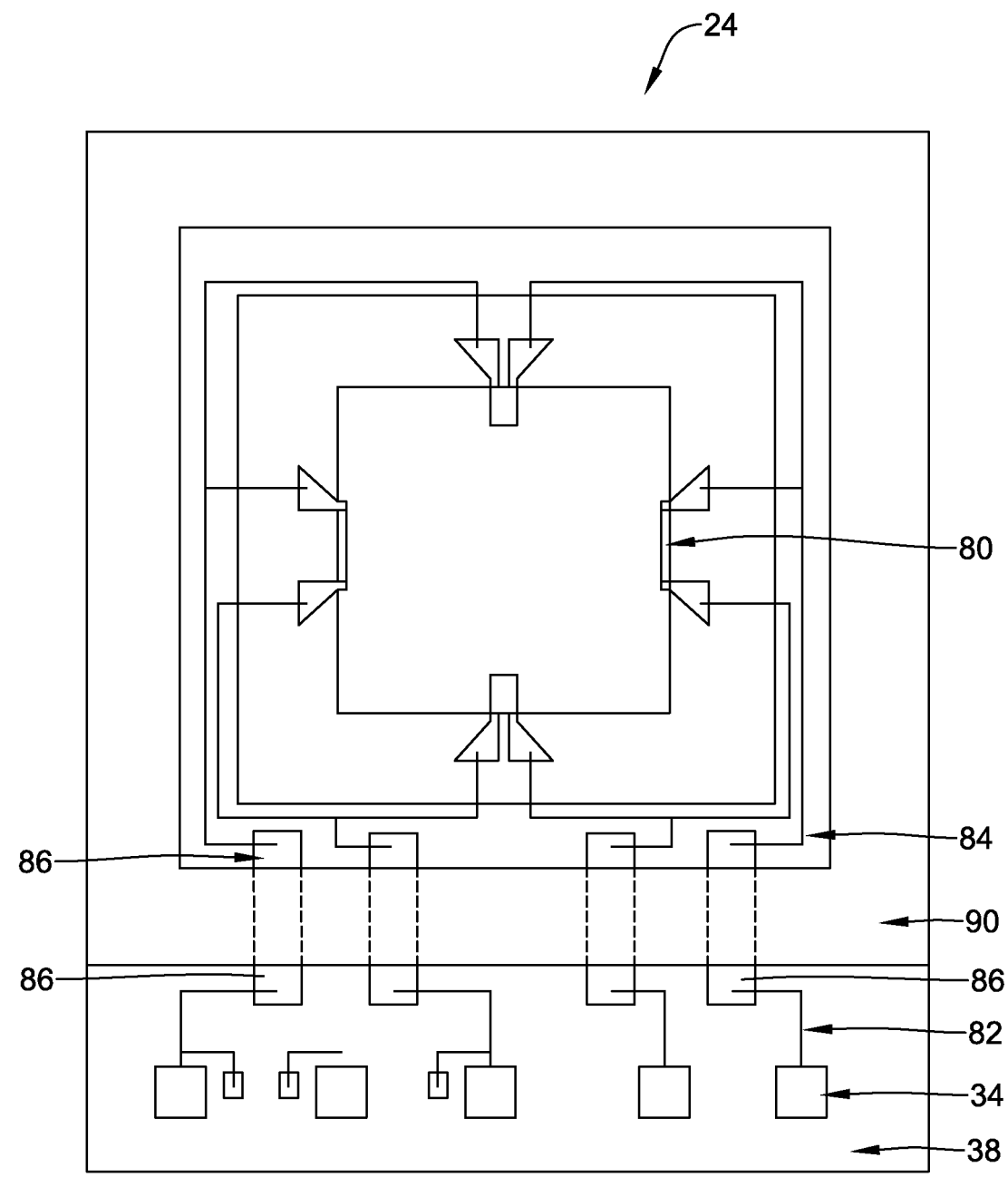
FIG. 4 is a schematic top view of a pressure sensing element that may be utilized in the pressure sensor of FIG. 1.

FIG. 4 is a top down, schematic view of an exemplary pressure sensor die 24 that may be used in the pressure sensor 10 as discussed herein. As shown in FIG. 4, the pressure sensing die 24 may include one or more wire bond pads 34 formed on the upper surface 38 which provide electrical connection to the sensing elements 80 through metal runners 82, 84 formed on the upper surface 38. In some cases, duck unders 86 may be formed under the upper surface 38 and pass under an area 90 where the top cap 20 may be bonded to the pressure sensing die 24. The duck unders 86 may be buried interconnect. In some cases, the duck unders 86 may be diffused or implanted regions that are rendered conductive.

Figure 5:
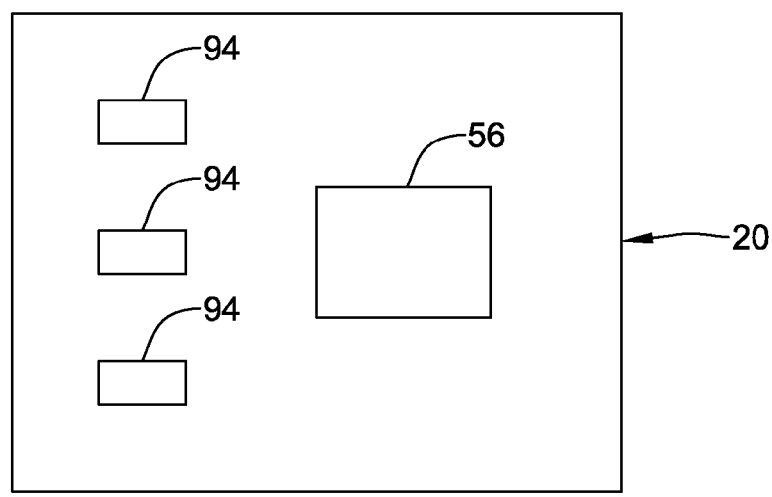
FIG. 5 is a schematic top view of a cap wafer that may be utilized in the pressure sensor of FIG. 1.

FIG. 5 is a top down, schematic view of an exemplary top cap 20. As shown in FIG. 5, the top cap 20 may include an opening or aperture 56 that may be generally aligned with the pressure sensing diaphragm 60 during fabrication of the pressure sensor 10 such that media introduced through the pressure port 14 comes into contact with an upper surface 38 of the sensing diaphragm 60 of pressure sensing die 24. Additionally, as is shown in FIG. 5, the top cap 20 may include one or more openings or holes 94 corresponding to one or more of the wire bond pads 34 disposed on the upper surface 38 of the pressure sensing die 24. During fabrication of the pressure sensor, the openings or holes 94 may be aligned with the wire bond pads 34 disposed on the pressure sensing die 24 such that when assembled, the wire bond pads 34 are exposed through the top cap 20 and accessible for electrical connection to other components via wire bonds or the like. While the opening or holes 94 may have any shape or size suitable for providing access to the wire bond pads 34, in some cases, the size, shape and dimension of the holes or openings 94 may generally correspond to the size, shape and dimensions of the wire bond pads 34 disposed on the pressure sensing die 24. Additionally, it will be generally understood that the top cap 20 may have a variety of sizes and shapes, depending upon the application, and is not limited to the size and shape shown in FIG. 5. For example, in some cases, the top cap wafer 20 may have a generally disc-like shape.

In operation, a media to be sensed can be provided to the first end 46 of the fluid passageway 42 of the optional pressure port 14. The media to be sensed will have a pressure, which is transmitted through the media to the sensing diaphragm 60. The applied pressure deforms the diaphragm 60. A pressure difference between the pressure of the media to be sensed and the pressure in the buried sealed cavity 64 causes a stress and/or deflection in the pressure sensing diaphragm 60 of the pressure sense die 24, which then stresses one or more sense elements 80 on the pressure sensing diaphragm 60. When the sense elements 80 are piezoresistive sense elements, applying a current through the sense elements 80 provides a signal that corresponds to the amount of pressure applied by the media to the sensing diaphragm 60. In some cases, the resulting signal may be conditioned by conditioning circuitry 81 and output via electrical leads (not shown).

A method of making a pressure sensor 10 may include obtaining a bonded wafer substrate having a buried sealed cavity 64, wherein a wall of the buried sealed cavity 64 forms a sensing diaphragm 60 along on an upper side of the bonded wafer substrate. One or more sense elements 80 may be provided on the sensing diaphragm 60 of the bonded wafer substrate. One or more bond pads 34 may be provided on the upper side of the bonded wafer substrate. Each of the one or more bond pads 34 may be positioned adjacent to the sensing diaphragm 60 and electrically connected to one or more of the sense elements 80. A top cap 20 may be secured to the upper side of the bonded wafer substrate. The top cap 20 may include an aperture 56 that facilitates passage of a media to the sensing diaphragm 60. The top cap 20 may also be configured to isolate the one or more bond pads 34 from the media during use.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. An absolute pressure sensor comprising:
   a pressure sensing element including:
      a bonded wafer substrate having a buried sealed cavity, wherein a wall of the buried seal cavity forms a sensing diaphragm along on an upper side of the bonded wafer substrate, wherein the bonded wafer substrate comprises a first substrate that is direct bonded to a second substrate, and wherein the buried sealed cavity is defined by a void between the first substrate and the second substrate, wherein the first substrate and the second substrate are formed from silicon;

one or more sense elements supported by the sensing diaphragm of he bonded wafer substrate;

one or more bond pads supported by the upper side of the bonded wafer substrate, wherein each of the one or more bond pads positioned adjacent to the sensing diaphragm and electrically connected to one or more of the one or more sense elements;

a top cap including an aperture, the top cap secured relative to the upper side of the bonded wafer substrate such that the aperture facilitates passage of a media in a downward direction to the sensing diaphragm, the top cap further configured to isolate the one or more bond pads of the pressure sensing element from the media, wherein the top cap is secured to the upper side of the bonded wafer substrate via at least one of an anodic bond or a glass frit bond; and a carrier coupled to a lower side of the second substrate.

2. The absolute pressure sensor of claim 1, wherein the buried sealed cavity is a reference pressure cavity.

3. The absolute pressure sensor of claim 1, wherein the buried sealed cavity is defined by an enclosed and sealed void between a lower surface of the bonded wafer substrate and an upper surface of the bonded wafer substrate.

4. The absolute pressure sensor of claim 1, wherein the buried sealed cavity is a vacuum sealed reference cavity.

5. The absolute pressure sensor of claim 1, wherein the one or more sense elements include one or more piezoresistive elements.

6. The absolute pressure sensor of claim 1, further comprising a pressure port in fluid communication with the aperture.

7. The absolute pressure sensor in claim 6, wherein the pressure port and the aperture define, at least in part, a media flow path that is isolated from the one or more bond pads of the pressure sensing element.

8. The absolute pressure sensor of claim 1, wherein the bonded wafer substrate includes a Silicon-On-Insulator (SOI) substrate.

9. The absolute pressure sensor of claim 1, wherein the pressure of the media is measured relative to the pressure in the buried sealed cavity.

10. The absolute pressure sensor of claim 1, wherein the top cap includes a hole or recess that is in registration with one or more of the one or more bond pads such that when the top cap is bonded relative to the upper side of the bonded wafer substrate, the one or more bond pads are accessible through the hole or recess for electrical connection.

11. The absolute pressure sensor of claim 1, wherein the carrier comprises a ceramic carrier, a glass carrier, or a printed circuit board.

12. A pressure sensor comprising:
a pressure sensing element including:
a first substrate;
a second substrate;
the first substrate direct bonded to the second substrate such that a recess formed in the first substrate and/or second substrate creates a sealed cavity between the first substrate and the second substrate, wherein the first substrate and the second substrate comprise silicon;
the first substrate defining a sensing diaphragm that forms part of the sealed cavity;

one or more sense elements supported by the sensing diaphragm of the first substrate;

a bond pad supported by the first substrate, wherein the bond pad is positioned adjacent to the sensing diaphragm and electrically connected to one or more of the one or more sense elements;

a top cap including an aperture, the top cap is secured relative to the first substrate such that the aperture facilitates passage of a media in a downward direction to the sensing diaphragm of the first substrate, the top cap configured to isolate the bond pad of the pressure sensing element from media, wherein the top cap is secured to the upper side of the bonded wafer substrate via at least one of an anodic bond or a glass frit bond;

a pressure port coupled to the top cap, the pressure port defining a fluid passage way to the aperture in the top cap; and a carrier coupled to a lower side of the second substrate.

13. The pressure sensor of claim 12, wherein the sealed cavity is a sealed m reference cavity.

14. The pressure sensor of claim 12, wherein the one or more sense elements include one or more piezoresistive elements formed on the sensing diaphragm of the first substrate.

15. The pressure sensor of claim 12, further comprising signal conditioning circuitry for conditioning a signal that is responsive to the one or more sense elements.

16. The pressure sensor of claim 12, wherein the top cap includes a hole or recess that is in registration with one or more of the one or more bond pads such that when the top cap is bonded relative to the upper side of the bonded wafer substrate, the one or more bond pads are accessible through the hole or recess for electrical connection.

17. The pressure sensor of claim 12, wherein the bonded wafer substrate includes a Silicon-On-Insulator (SOI) substrate.

18. A method of making a pressure sensor, comprising:
obtaining a bonded wafer substrate having a buried sealed cavity, wherein a wall of the buried seal cavity forms a sensing diaphragm along on an upper side of the bonded wafer substrate, wherein the bonded wafer substrate comprises a first substrate direct bonded to a second substrate, and wherein the bonded wafer substrate comprises silicon;

providing one or more sense elements on the sensing diaphragm of the bonded wafer substrate;

providing one or more bond pads on the upper side of the bonded wafer substrate, each of the one or more bond pads positioned adjacent to the sensing diaphragm and electrically connected to the one or more of the sense elements;

securing a top cap to the upper side of the bonded wafer substrate via at least one of an anodic bond or a glass frit bond, the top cap including an aperture that facilitates passage of a media in a downward direction to the sensing diaphragm, the top cap also isolating the one or more bond pads from the media during use; and coupling a carrier to a lower side of the second substrate.

19. The method of claim 18, wherein the one or more sense elements include one or more piezoresistive elements.

20. The method of claim 18, wherein the top cap includes a hole or recess that is in registration with one or more of the one or more bond pads such that when the top cap is bonded relative to the upper side of the bonded wafer substrate, the one or more bond pads are accessible through the hole or recess for electrical connection.

* * * * *